(12) United States Patent
Kim

(10) Patent No.: US 6,178,001 B1
(45) Date of Patent: Jan. 23, 2001

(54) METHOD AND APPARATUS FOR OPTICAL FREQUENCY MODULATION CHARACTERIZATION OF LASER SOURCES

(75) Inventor: Kihong Kim, Kanata (CA)

(73) Assignee: Nortel Networks Limited, Montreal (CA)

(*) Notice: Under 35 U.S.C. 154(b), the term of this patent shall be extended for 0 days.

(21) Appl. No.: 09/390,214

(22) Filed: Sep. 8, 1999

(51) Int. Cl.[7] ........................................... G01B 9/02
(52) U.S. Cl. ............................. 356/477; 356/478
(58) Field of Search ................................ 356/477, 478

(56) References Cited

U.S. PATENT DOCUMENTS 5,515,166   5/1996   Mori et al. ........................ 356/345

*Primary Examiner*—Robert Kim

(57) ABSTRACT

The present invention provides a cost-effective method and apparatus for optical frequency modulation (FM) characterization of a laser source and provide a measure of laser chirp by using inexpensive equipment that is readily available. In order to measure the chirp, the invention makes use of interferometry without resorting to expensive and bulky equipment such as optical network or optical spectrum analyzers.

In a preferred embodiment, the chirp characteristic of a laser source is measured by injecting an input signal at a particular modulation frequency into the laser source under test to generate an optical signal and passing the optical 15 signal generated into an asymmetrical Mach Zehnder interferometer (AMZI). Because the AMZI exhibits a cyclical wavelength to photo-current response, a number of high frequency ripples or interference ripples are introduced in the optical signal. According to the invention, the interference ripples introduced within a half modulation period of the laser input signal are counted to provide a measure of the approximate chirp amount on the modulated frequency.

27 Claims, 6 Drawing Sheets

METHOD AND APPARATUS FOR OPTICAL FREQUENCY MODULATION CHARACTERIZATION OF LASER SOURCES

FIELD OF THE INVENTION

The present invention relates generally to the characterization of communication laser sources, and more particularly to the optical frequency modulation characterization of communication laser sources by interferometry.

BACKGROUND OF THE INVENTION

In a typical fiber optic transmission network, optical frequency modulation (FM) characteristics of communication laser sources such as laser diodes must be accurately determined in order to define the limits within which information can be reliably modulated and exchanged between optical terminals in the network. The optical frequency behavior of a particular laser source under modulation is determinative of the ability of that laser source to transmit information. When a laser source is directly modulated with an input current signal, the laser source output exhibits a frequency deviation (Δf) per milliAmpere which varies as a function of the laser input modulation frequency. This FM characteristic is commonly referred to as the laser chirp. For most optical systems, an accurate characterization of laser chirping is essential to ensure transmission accuracy and improve performance. For example, in wavelength division multiplex (WDM) networks, laser chirp measurements are used to fine tune the laser operating wavelengths for an optimal use of the available optical bandwidth thereby enhancing transmission performance.

Presently, laser chirp is measured with specialized equipment that typically includes sophisticated network or optical spectrum analyzers. For network applications using multiple laser sources, the use of this equipment is not cost-effective. In a typical WDM network for example, many laser sources are used in different transmitting terminals which necessitates the duplication of the chirp measuring equipment used for each transmitting location. Duplicating this equipment for each transmitting location in the network may very rapidly prove to have a major impact on the cost associated with chirp characterization.

There may be situations where it is practical to use the same equipment for laser sources in different locations. In these cases, it would also be desirable to have chirp-measuring equipment that is simple and more portable. This is due to the fact that the chirp measurement equipment currently used is heavy and bulky which makes it difficult to transport between transmitting sites.

SUMMARY OF THE INVENTION

The present invention addresses these issues and to this end provides a methodology and apparatus to avoid the present limitations in this art.

The present invention provides a cost-effective apparatus and method for optical frequency modulation (FM) characterization of a laser source and provide a measure of laser chirp by using inexpensive equipment that is readily available. The invention makes use of interferometry to efficiently measure the chirp of a laser source in a simple manner without resorting to expensive and bulky equipment such as optical network or optical spectrum analyzers.

According to a preferred embodiment, the chirp characteristic of a laser source can be measured by injecting an input signal at various modulation frequencies into the laser source under test and passing the optical signal generated by the laser source into an asymmetrical Mach Zehnder interferometer (AMZI). For each modulation frequency used, the laser input signal induces an optical frequency deviation in he optical signal generated which is converted by the AMZI into cyclical variations in optical power of the optical signal. Because the AMZI exhibits a cyclical wavelength to photo-current response, a number of high frequency ripples (hereinafter referred to as interfering ripples) are introduced in the optical signal. According to the invention, the interference ripples introduced therein are counted over a half modulation period of the laser input signal to provide a measure of the approximate chirp amount on each modulated frequency.

In order to determine the number of interfering ripples brought about by the AMZI, the optical signal is converted into an electrical form which is representative of the interfering ripples introduced. The electrical signal is then subsequently applied to an oscilloscope for an estimation of the number of ripples within a half modulation period of the laser input signal.

For optimal chirp measurement, the AMZI is preferably designed with a short free spectral range (FSR) so as to introduce a large number of interference ripples within a half modulation period. According to the invention, the AMZI FSR is used as a measuring unit and defines the degree of accuracy with which chirp measurements are made.

Advantageously, the chirp measurement apparatus used by the present invention is simple and more portable. In particular, the interferometry circuit used for converting variations in frequency in the laser output signal into variations in optical power can be easily transported or alternatively duplicated and integrated in multiple transmitting sites at a reasonable cost. Further, the invention advantageously uses a low-cost oscilloscope which is also more portable than the optical network or optical spectrum analyzers used in conventional chirp measurement systems.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Preferred embodiments of the invention will now be described with reference to the attached drawings in which.

DETAILED DESCRIPTION OF THE PREFERRED EMBODIMENTS

Figure 1A:
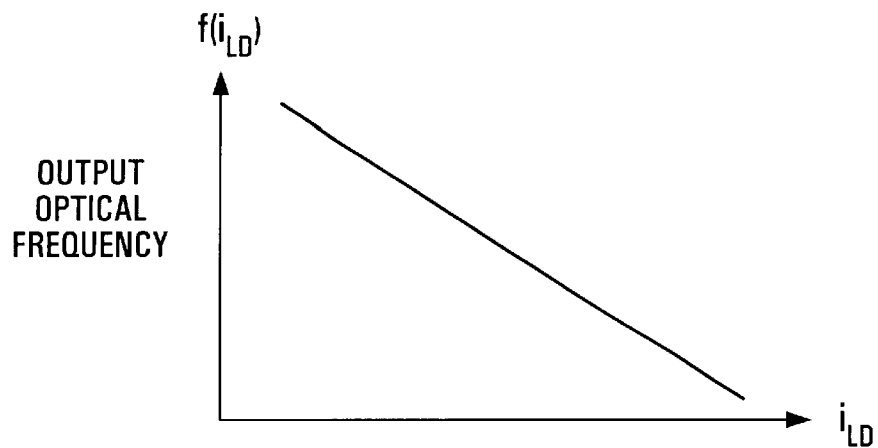
FIG. 1A shows an optical frequency plot of a typical laser source output signal denoted by $f(i_{LD})$ as a function of laser input current.
Figure 1B:
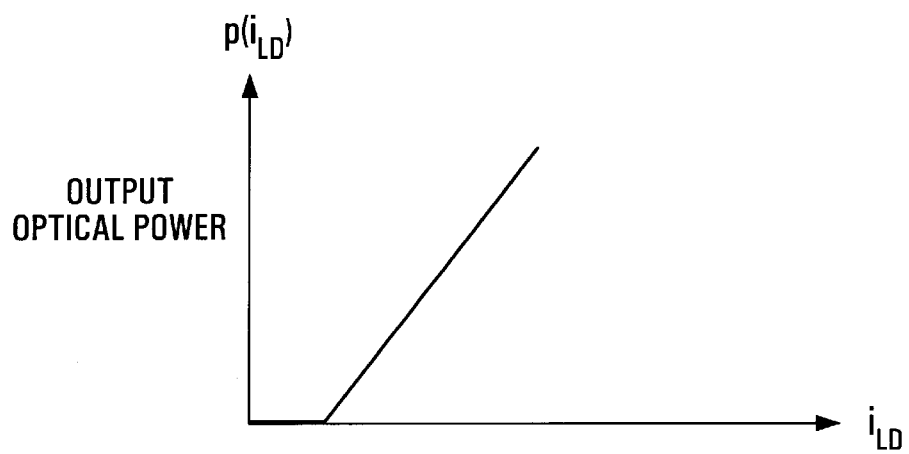
FIG. 1B shows an optical power plot of a typical laser source output signal denoted by $p(i_{LD})$ as a function of laser input current.

As is well known, conventional laser sources such as laser diodes exhibit modulation characteristics which make them well-suited for transmitting information optically. As shown in FIGS. 1A and 1B, varying the laser input current induces variations in the optical frequency (frequency modulation) and power (intensity modulation) of the laser output signal generated. In particular, FIG. 1A shows as a example, an optical frequency plot of the output of a typical laser source denoted by $f(i_{LD})$ as a function of laser input current $i_{LD}$ for a low frequency laser input current modulation regime. The frequency response of the laser source is dependent upon the laser input current modulation frequency and the frequency plot $f(i_{LD})$ illustrated in Figure is only representative of a low frequency modulation regime. FIG. 1B shows also as a example, an optical power plot $p(i_{LD})$ of the same laser output also as a function of the laser input current $i_{LD}$.

In order to properly use a laser source to optically transmit information, an optical frequency modulation (FM) characterization of the laser source must be carried-out in order to define the limits within which information can be reliably transmitted and exchanged between optical terminals in the network. This optical FM characterization includes a determination of what is generally known as laser chirp. Chirp in a laser source is determinative of the ability of that particular laser source to transmit information and is the result of a number of transient effects which occur as a result of changes in the laser input modulation frequency. For a particular modulation signal current and frequency, laser chirp is defined as the frequency deviation ($\Delta f$) observed in the laser source output signal per milliampere of laser input current as a function of the laser input modulation frequency.

Figure 2:
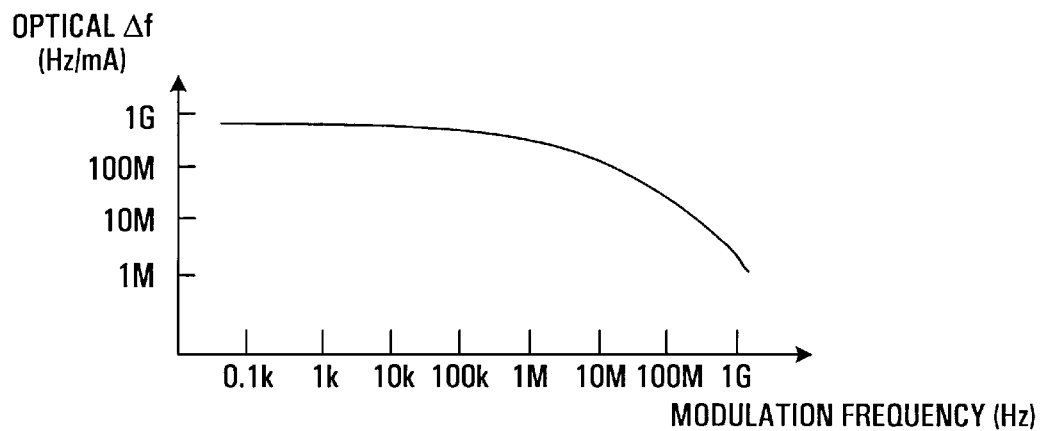
FIG. 2 is a graphical representation of a typical frequency modulation (FM) deviation transfer curve for a distributed feedback (DFB) laser diode.

To further illustrate this, reference is now made to FIG. 2 where a plot of the laser chirp or optical FM deviation transfer curve of a typical DFB laser diode is shown for a modulation frequency range extending from 0 Hz to 1 GHz. From this figure, it can be observed that the frequency shift of the DFB laser diode is approximately 0.5 GHz per mA for modulation frequencies up to around 10 MHz. This shift is principally caused by thermal chirp. For modulation frequencies over 10 MHz up to 1 GHz, it can be observed that there is a gradual roll-off of the amplitude of the laser diode output frequency swing. In this frequency range, the thermal effects decrease and the frequency swing is increasingly caused by other characteristics of the laser diode such as adiabatic chirp and relaxation oscillations. These characteristics are well-known in the art and, as such, are not discussed here in any detail.

The present invention provides a cost-effective method and apparatus for measuring chirp in laser sources. The invention makes use of asymmetrical Mach-Zehnder interferometry to efficiently measure laser chirp without resorting to expensive and bulky equipment such as optical network or optical spectrum analyzers. The invention can be used to measure the chirp characteristic of any laser source. For clarity however, the invention will now be described only in relation to laser diodes.

Figure 3:
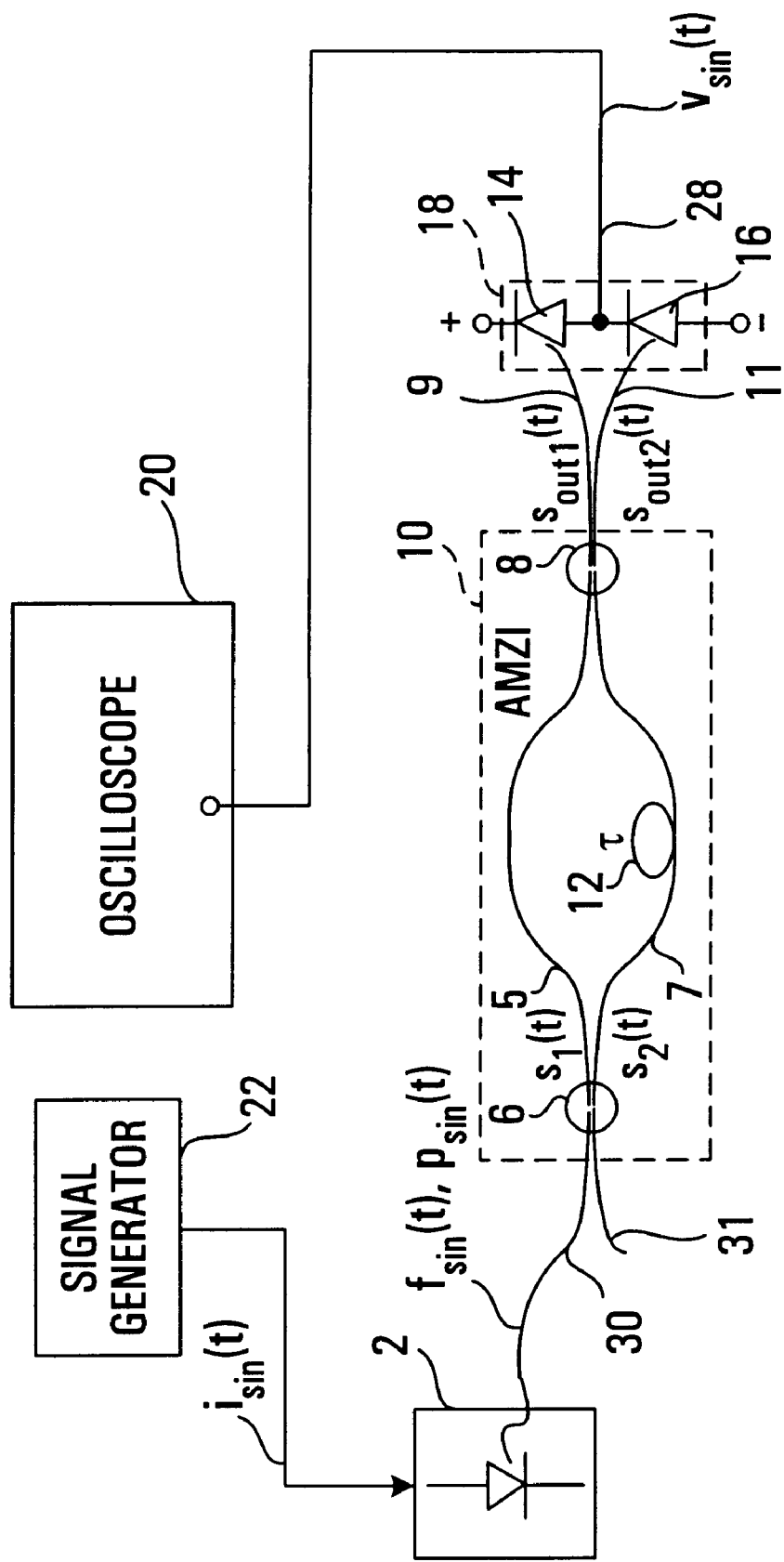
FIG. 3 is a schematic illustration of a chirp measurement circuit according to a preferred embodiment of the invention featuring an asymmetrical Mach-Zehnder interferometer (AMZI)

Referring now to FIG. 3, there is illustrated a preferred embodiment of the invention for measuring the chirp characteristic of a particular laser diode 2. This invention makes use of an AMZI generally indicated by 10 and a balanced photo-detector generally indicated by 18. The balanced detector 18 consists of a pair of photo-diodes 14, 16 connected in a push-pull or balanced detection arrangement. The detector 18 is connected to an oscilloscope 20 for determining the chirp of the laser diode 2 under test.

In order to measure the chirp of the laser diode 2, an input signal $i_{LD}(t)$ of a particular modulation frequency $f_m$ is injected into the laser diode 2. In the preferred embodiment of FIG. 3, the input signal $i_{LD}(t)$ is shown as generated by a signal generator 22 connected to the laser diode 2 under test. It is understood that the input signal $i_{LD}(t)$ could alternatively be generated by other signal generating means such as, for example, a signal generating function embodied in the oscilloscope 20.

In response to the input signal $i_{LD}(t)$ applied, the laser diode 2 generates an optical signal o(t) whose frequency and optical power characteristics are reflective of the input signal current. According to the invention, the chirp produced by the laser diode 2 for the particular modulation frequency of the input signal current can be measured by passing the optical signal o(t) generated into an asymmetrical Mach-Zehnder interferometer (AMZI) and counting the number of interfering ripples introduced by the AMZI within a half modulation period of the laser input signal $i_{LD}(t)$. As will be described below in further detail, the number of interfering ripples counted provides a measure of the approximate chirp amount exhibited by the laser diode 2 for a particular laser input signal modulation frequency.

The laser input signal $i_{LD}(t)$ necessary for measuring the chirp of the laser diode 2 under test can take various forms provided it is cyclical with amplitude levels all above the lasing threshold such that the laser diode can operate in a continuous mode. Preferably, the input signal $i_{LD}(t)$ is sinusoidal (or triangular). For the purpose of example, FIGS. 4A and 4B show referenced the optical frequency and power characteristics curves of FIGS. 1A and 1B a sinusoidal laser input signal $i_{sin}(t)$ at an operating point A which can be used to determine the chirp of the laser diode 2 under test.

At the operating point A, the laser input signal $i_{sin}(t)$ has an average DC value denoted by $I_{DC}$ around which it oscillates at a modulation frequency $f_m$ with a peak-to-peak amplitude $\Delta I$. The operating point A is selected to confine the peak-to-peak excursions of the laser input signal $i_{sin}(t)$ above the lasing threshold such that the laser diode 2 always operates in a linear region.

Figure 4A:
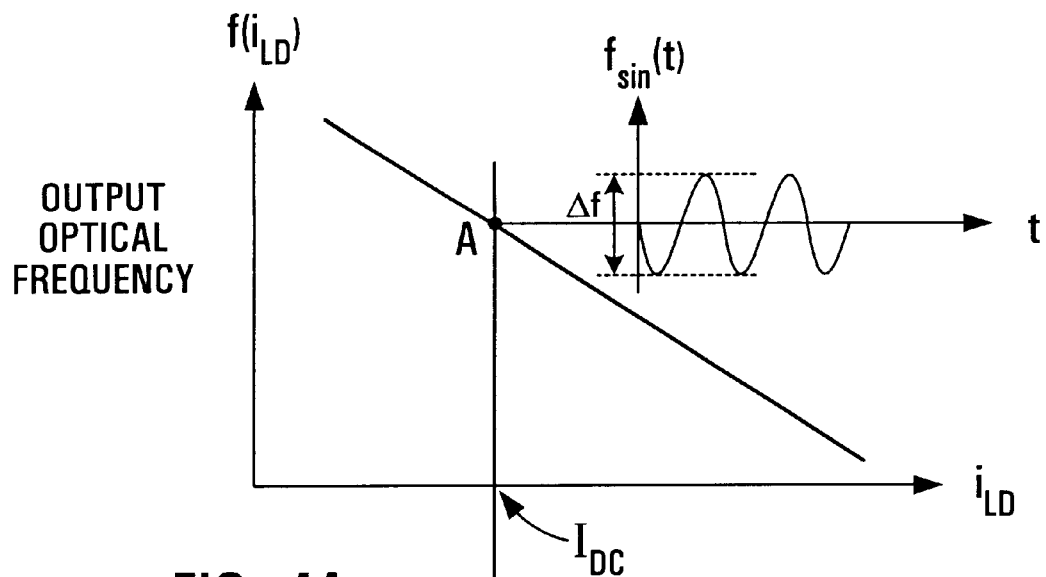
FIG. 4A shows referenced to the laser source output signal $f(i_{LD})$ of FIG. 1A, an optical frequency/time plot of an optical signal denoted by $f_{sin}(t)$ which is produced as a result of sinusoidal modulation of the laser diode of FIG. 3.
Figure 4B:
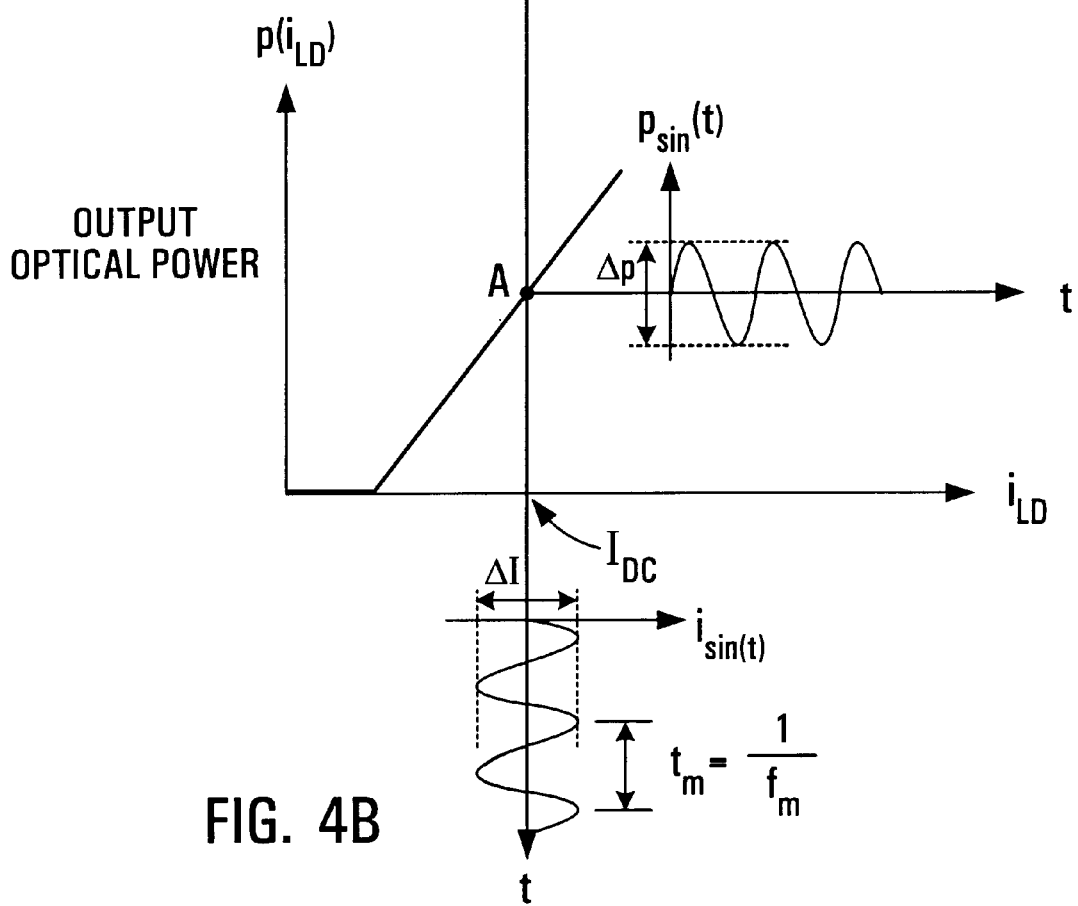
FIG. 4B shows referenced to the laser source output signal $p(i_{LD})$ of FIG. 1B, an optical power/time plot of an optical signal denoted by $p_{sin}(t)$ which is produced as a result of sinusoidal modulation of the laser diode of FIG. 3.

FIGS. 4A and 4B also show the optical frequency and power characteristics of a corresponding optical signal $o_{sin}(t)$ generated by the laser diode 2 as a result of direct modulation by the laser input signal $i_{sin}(t)$. The optical signal $o_{sin}(t)$ is shown in the form of its optical frequency and power characteristics. FIG. 4A shows referenced to the optical frequency/time plot of FIG. 1A, an optical frequency/time plot $f_{sin}(t)$ of the laser diode output signal $o_{sin}(t)$ at the operating point A and FIG. 4B shows referenced to the optical power/time plot of FIG. 1B, an optical power/time plot $p_{sin}(t)$ of the laser diode output signal $o_{sin}(t)$ at the same operating point A.

From these figures, it can be observed that in response to this sinusoidal current modulation by $i_{sin}(t)$, the laser diode output power $p_{sin}(t)$ varies sinusoidally at the modulation frequency $f_m$ with a peak-to-peak amplitude of $\Delta P$. It can also be observed that the laser input signal $i_{sin}(t)$ also induces in the laser output signal $o_{sin}(t)$ a sinusoidal optical frequency deviation denoted by $f_{sin}(t)$ at the modulation frequency $f_m$ with a peak-to-peak amplitude $\Delta f$. The optical frequency deviation $\Delta f$ results in a laser chirp ($\Delta f/mA$) which, as noted before, is expressed as a function of the modulation frequency $f_m$.

Referring back to FIG. 3, in order to measure the laser chirp produced by the laser diode 2 under test, the frequency deviation $\Delta f$ occurring in the laser output signal $o_{sin}(t)$ must be determined. For this, the optical signal $o_{sin}(t)$ is fed into the AMZI 10 which operates to convert the optical frequency variations in the optical signal $o_{sin}(t)$ to cyclical variations in optical power. As will be explained below in further detail, the AMZI 10 exhibits a wavelength to photocurrent response formed of a repetition of peaks and valleys which introduces high frequency ripples (hereinafter also referred to as interference ripples) in the laser output signal power $p_{sin}(t)$.

Referring back to FIG. 3, the AMZI 10 has two inputs 30, 31 and two outputs 9, 11. The AMZI 10 is designed to receive the laser output signal $o_{sin}(t)$ in one input 30 while the other input 31 is left unconnected. The AMZI 10 consists of two 3dB fiber couplers 6, 8 interconnected with two single-mode fiber arms 5, 7 and a delay line 12 of a variable length L located on arm 7. The AMZI outputs 9, 11 produce an intermediate optical signal in the form of complementary output signals which are denoted by $s_{out1}(t)$ and $s_{out2}(t)$. The AMZI outputs 9, 11 are coupled respectively to the photodiodes 14 and 16 of the balanced photo-detector 18. The photo-detector 18 produces an electrical output signal $v_{sin}(t)$ which is fed on line 28 into an oscilloscope 20 for chirp measurement.

In the AMZI 10, the coupler 6 functions as a splitter, dividing the $o_{sin}(t)$ optical signal power equally to form two optical signals, $s_1(t)$, $s_2(t)$ which respectively travel in the fiber arms 5 and 7. By operation of the delay line 12, the optical signal $s_2(t)$ propagating in arm 7 is delayed by a delay $\tau$ such that at the coupler 8, it interferes with the other optical signal $s_1(t)$ traveling in arm 5 to produce the complementary signals $s_{out1}(t)$ at output 9 and $s_{out2}(t)$ at output 11. The AMZI outputs 9, 11 are each characterized by a respective power transfer function $H_1(f)$, $H_2(f)$ which are known to be:

$$H_1(f)=A+B\sin^2(\pi f^* \tau), H_2(f)=A+B\cos^2(\pi^* f^* \pi)$$

where A and B are scaling factors.

Figure 5:
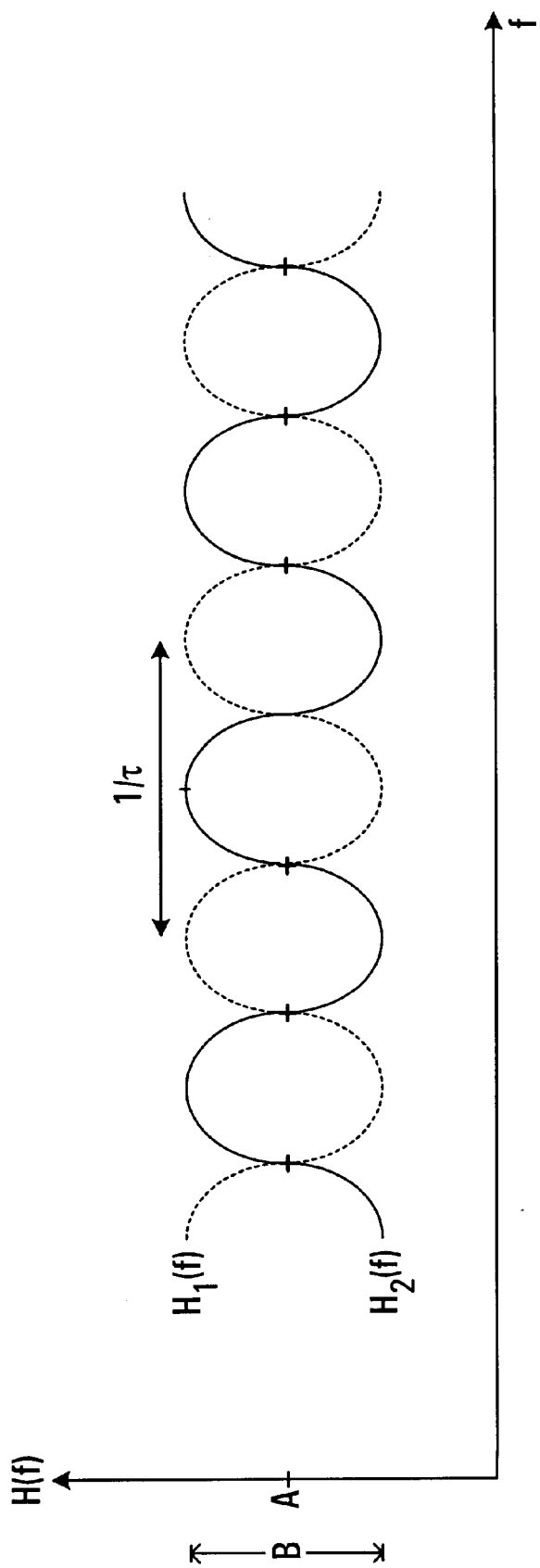
FIG. 5 is a diagram of the power transfer functions for the AMZI shown in FIG. 3.

FIG. 5 shows a frequency plot of each AMZI output power transfer function $H_1(f)$, $H_2(f)$ which are respectively drawn as a full and a dotted line. The period of free spectral range (FSR) for each AMZI outputs 9 and 11 is $\tau^{-1}$ and their respective power transfer functions $H_1(f)$, $H_2(f)$ are sinusoidal and out of phase by 180 degrees.

The AMZI output power transfer functions $H_1(f)$, $H_2(f)$ are indicative of the amount of optical power generated at each AMZI output 9, 11 as a function of the operative frequency of the laser output signal $o_{sin}(t)$. In terms of optical power produced, the AMZI outputs 9, 11 are complementary to one another such that for any given $o_{sin}(t)$ frequency, the sum of the optical power produced by each AMZI output 9, 11 is always equal to the amount of optical power carried by $o_{sin}(t)$ at that particular frequency.

The present invention takes advantage of the cyclical nature of the AMZI frequency response to provide an effective measurement mechanism for determining chirp in the laser diode 2 for a particular modulation frequency $f_m$. As noted above, when the laser input signal $i_{sin}(t)$ induces a frequency deviation $\Delta f$ in the laser output signal $o_{sin}(t)$, the AMZI 10 introduces a number of interfering ripples in the laser output signal $o_{sin}(t)$ such that the optical frequency variation induced therein is converted into cyclical optical power variations or interference ripples.

Each interference ripple introduced in $o_{sin}(t)$ corresponds to a full cycle of the AMZI frequency response (see FIG. 5) and denotes a frequency shift in the optical signal $o_{sin}(t)$ equal to the AMZI frequency cycle bandwidth or FSR ($1/\tau$). According to the present invention, the AMZI FSR is used as a measuring unit for determining the frequency deviation $\Delta f$ and defines the degree of accuracy with which the frequency deviation is measured.

For optimal chirp measurement, the AMZI 10 is designed with a short frequency spectral repetition by selecting an appropriate FSR that can provide a sufficiently accurate measure of the frequency deviation $\Delta f$. Generally, the FSR is selected in relation to the particular laser input signal modulation frequencies used for measuring the laser chirp. As an example, for a laser input signal $i_{sin}(t)$ with a modulation frequency less than 10 MHz, an FSR of 1 GHz would be sufficient to provide a reasonably accurate measure of the frequency deviation $\Delta f$. For modulation frequencies greater than 10 MHz, an FSR of 1 GHz would still be adequate although a smaller FSR (larger delay $\tau$) could be used to provide a more accurate measure of the frequency deviation $\Delta f$.

Once selected to provide an adequate measuring unit for determining the frequency deviation $\Delta f$ with acceptable accuracy, the AMZI FSR ($1/\tau$) is implemented by selecting an appropriate length L for the delay line 12. With the FSR ($1/\tau$) determined, the corresponding delay $\tau$ can be identified since, as noted above, an FSR period is equal to $1/\tau$. If the effective refractive index $\eta_{\mathit{eff}}$ of the AMZI fiber arms 16, 18 is known, the desired fiber length, L, for a time delay $\tau$ can be determined using the following equation:

$$L=(c/\eta_{\mathit{eff}})^*\tau$$

where c is the speed of light in vacuum. As this delay line 12 is a function of the AMZI FSR, it ultimately dictates the accuracy level with which the frequency deviation induced in the optical signal $o_{sin}(t)$ is calculated.

As an example, if an FSR of 1 GHZ is selected, the necessary length for the delay line 12 can be determined by first calculating the delay $\tau$ corresponding to a 1 GHz FSR. With the FSR known, the corresponding delay $\tau$ can be identified with the above expression:

$$FSR=1/\tau=1 \text{ GHz};$$

From this, the necessary delay $\tau$ for the delay line 12 (see FIG. 5A) can be calculated as follows:

$$\tau=1/1 \text{ GHz}=1 \text{ nS}$$

According to the above, $\tau=1$ nS. If the effective refractive index of the fiber arms 16, 18 is known to be $\eta_{\mathit{eff}}=2$, the desired fiber length, L, for a time delay $\tau=1$ nS can be determined with the above equation as follows:

2, the desired fiber length, L, for a time delay $\tau=1$ nS can be determined with the above equation as follows:

$$L=(c/\eta_{\mathit{eff}})^*\tau=(3^*10^8 \text{ m/S})/2^*1 \text{ nS}=0.2 \text{ meter}$$

With this delay line length, the AMZI will exhibit a 1 GHz FSR. As will be explained below in further details, the AMZI FSR as selected can then be used to determine the frequency variation $\Delta f$ which in turn, can be used to establish the laser chirp of the laser diode 2 exhibited under test at the modulation frequency $f_m$.

The number of ripples introduced is directly proportional to the size of the frequency deviation $\Delta f$ induced in the laser output signal $o_{sin}(t)$. More specifically, the larger the frequency deviation $\Delta f$, the greater the number of interfering ripples introduced. Conversely, the smaller the frequency deviation $\Delta f$, the smaller the number of interfering ripples introduced. According to the invention, the ripples introduced within a half period of the modulation frequency $f_m$ are counted to provide a measure of the frequency deviation $\Delta f$ for the particular modulation frequency $f_m$ at which the laser input signal $i_{sin}(t)$ operates. By operating $i_{sin}(t)$ at different modulation frequencies and counting the number of interfering ripples produced on each modulated frequency, a chirp characteristic curve such as that illustrated in FIG. 2 can be obtained which shows how the chirp for the particular laser diode 2 under test varies as a function of the laser input modulation frequency.

In order to determine the number of interfering optical power ripples brought about by the AMZI 10, the AMZI output signals $s_{out1}(t)$, $s_{out2}(t)$ are converted into the electrical signal $v_{sin}(t)$ by the balanced detector 18. By converting the AMZI output signals $s_{out1}(t)$, $s_{out2}(t)$ to an electrical form, the optical power variations are proportionally translated into voltage ripples where each voltage ripple corresponds to a respective interference ripple introduced by the AMZI 10. These voltages ripples can then be counted with the oscilloscope 20 for measuring the frequency deviation and hence the chirp exhibited by the laser diode 20 under test at the particular modulation frequency $f_m$.

Figure 6:
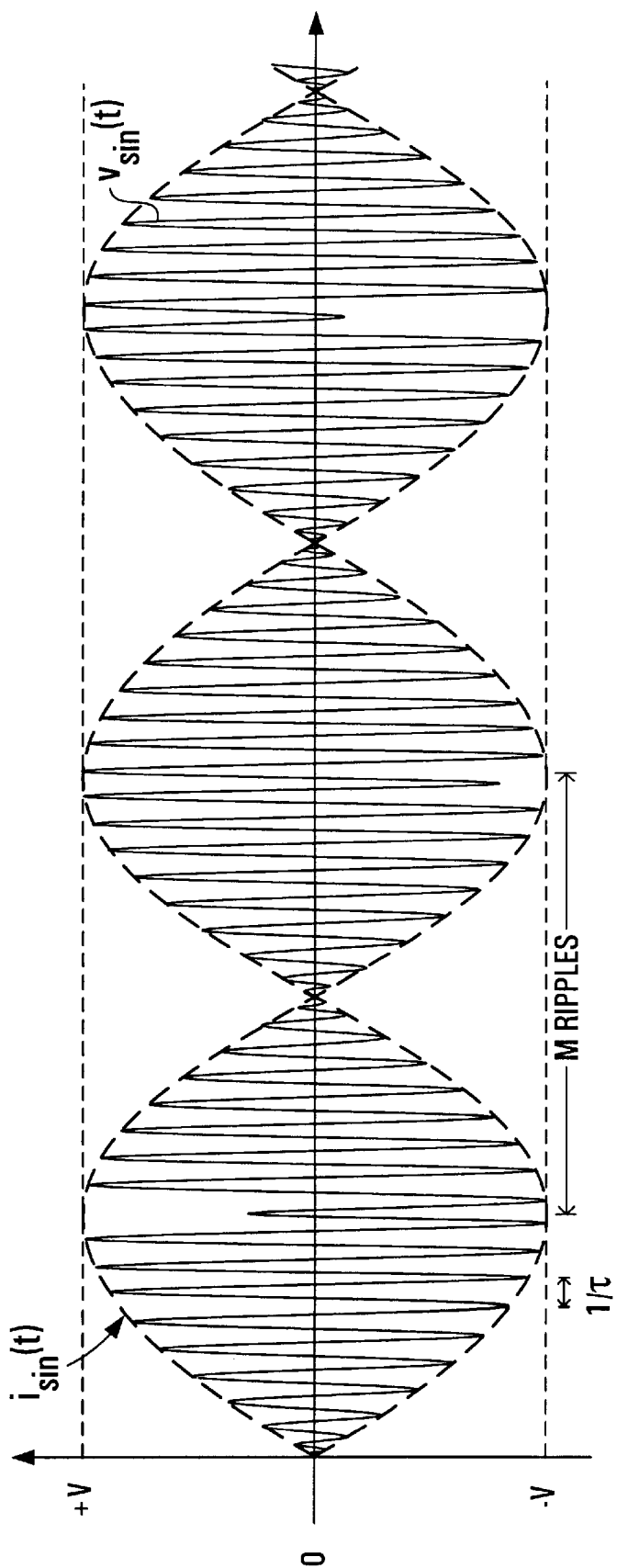
FIG. 6 shows a voltage/time plot of an electrical signal $v_{sin}(t)$ produced by the circuit of FIG. 3 in response to sinusoidal current modulation of the laser diode of FIG. 3.

To further illustrate this, FIG. 6 shows a magnified plot of the sinusoidal signal current $i_{sin}(t)$ shown in FIGS. 4A and 4B and the resulting electrical signal $i_{sin}(t)$ produced by the balanced detector 18. The signal $v_{sin}(t)$ is shown as oscillating around zero between positive and negative voltage amplitudes respectively denoted by +V and −V as a result of the balanced detection. For clarity, $i_{sin}(t)$ and $v_{sin}(t)$ are respectively drawn as a dotted and a full line.

In this particular sinusoidal laser input signal $i_{sin}(t)$ example, the frequency deviation $\Delta f$ induced in the laser output signal $o_{sin}(t)$ occurs during a peak-to-peak excursion of the laser input signal $i_{sin}(t)$ over a half modulation period $\frac{1}{2}f_m$ or $t_m/2$. When the laser output signal $o_{sin}(t)$ undergoes a frequency deviation $\Delta f$, the output signal $o_{sin}(t)$ sweeps across a number of AMZI frequency response cycles (see FIG. 5). As the laser input signal $i_{sin}(t)$ varies sinusoidally at a constant modulation frequency $f_m$ and peak-to-peak amplitude, the output signal $o_{sin}(t)$ will continually sweep across the same number of AMZI frequency response cycles back and forth at the modulation frequency $f_m$.

As a result of the sweep, the AMZI introduces interference ripples or cyclical variations in the optical power $p_{sin}(t)$ of the optical signal $o_{sin}(t)$ where each interference ripple corresponds to a cycle of the AMZI frequency response. The interference ripples induced are proportionally translated by the balanced detector 18 into voltage ripples in $v_{sin}(t)$ where each voltage ripple corresponds to a respective interference ripple introduced by the AMZI 10. Within a half modulation period ($\frac{1}{2}f_m$) of the electrical signal $v_{sin}(t)$, there are M interference ripples introduced in the laser output signal power $p_{sin}(t)$. From FIG. 6, it can be observed that in an electrical form, these interference ripples appear as M voltage ripples in the electrical signal $v_{sin}(t)$.

In accordance with the present invention, the voltage ripples introduced within a half modulation period ($\frac{1}{2}f_m$) of the laser input signal, such as, for example, the sinusoidal laser input signal $i_{sin}(t)$, are counted with the oscilloscope 20 to determine the frequency deviation $\Delta f$ and calculate the associated laser chirp for the particular modulation frequency $f_m$ at which the laser input signal operates.

There are various ways of counting the number of ripples with the oscilloscope 20. Preferably, the ripples are counted by a user visually inspecting the electrical signal $v_{sin}(t)$ after it is displayed on the oscilloscope 20. For more accuracy, the ripples could alternatively be counted by a counting function embodied in the oscilloscope 20 (if available).

Depending on the laser input signal $i_{sin}(t)$ and hence the frequency deviation $\Delta f$ induced in the laser output signal $o_{sin}(t)$, the number of interference ripples introduced by the AMZI 10 may not necessarily correspond to an integer value. In addition to a sweep of multiple AMZI frequency response cycles, there will be situations where the frequency deviation $\Delta f$ causes the laser output signal $o_{sin}(t)$ to sweep across an additional fraction of a cycle of the AMZI frequency response. As it can be observed in FIG. 6, this would occur at the peaks and valleys of the laser input current $i_{sin}(t)$.

More specifically, during a half modulation period ($\frac{1}{2}f_m$), the laser input current $i_{sin}(t)$ is increased (or decreased) such that it induces a frequency deviation $\Delta f$ in the laser output signal $o_{sin}(t)$ which, as a result, sweeps across a number M of AMZI frequency response cycles in a particular direction along the AMZI frequency response. When the laser input current $i_{sin}(t)$ is at an amplitude peak (or valley), the laser output signal $o_{sin}(t)$ completes its sweep of the AMZI frequency response in that particular direction and may finish the sweep anywhere within a particular AMZI frequency response cycle which, as a result, is only partially swept.

As the laser input current $i_{sin}(t)$ is reduced (or increased), the laser output signal $o_{sin}(t)$ initiates a new sweep in an opposite direction along the AMZI frequency response, sweeping initially across the same partially swept cycle and subsequently across M other cycles until the laser input current $i_{sin}(t)$ reaches the next valley (or peak) at which time the laser output signal $o_{sin}(t)$ completes its sweep of the AMZI frequency response in that particular direction and again, may finish the sweep anywhere within a particular AMZI frequency response cycle. This would also result in a partial sweep of this cycle.

As a result of these partial sweeps, the AMZI introduces interference ripples or cyclical variations which are not as prominent as the interference ripples introduced as a result of a complete sweep. Nevertheless, these interference ripples are also proportionally translated by the balanced detector 18 into voltage ripples in $v_{sin}(t)$. The voltage ripples introduced as a result of a partial sweep do not follow the laser input signal envelope and, as a result, are shown in FIG. 6 with a lower amplitude.

As a result of these partial sweeps, the count accuracy for the ripples counted within a half modulation period ($\frac{1}{2}f_m$) of the laser input signal $i_{sin}(t)$ is given by $\pm 1/M$ where M is the total number of ripples counted within a half modulation period ($\frac{1}{2}f_m$). For this, it follows that the count accuracy can be improved by selecting a small enough FSR relative to the modulation period tm such that the number of ripples M present within a half modulation period ($\frac{1}{2}f_m$) is sufficiently large.

Once the number of voltage ripples present in a half modulation period ($\frac{1}{2}f_m$) is counted, the frequency deviation Δf can be determined by multiplying the voltage ripple count by the AMZI FSR. If M ripples are counted within a half modulation period (½$f_m$), the frequency deviation is given by:

$$\Delta f = M*(1/\tau)$$

with a frequency deviation accuracy of ±1/M*(1/τ).

Once the frequency deviation Δf present on the modulation frequency $f_m$ is determined, the laser chirp on that particular modulation frequency can be calculated since, as noted above, the chirp is the frequency deviation (peak-to-peak) per mA of laser input signal current:

$$\text{chirp}(f_m) = \Delta f \text{ per mA}$$

As an example, for a 1 mA peak-to-peak laser input signal $i_{sin}(t)$ inducing, for example, a frequency deviation of Δf=500 MHz, the laser chirp is calculated as follows:

$$\text{chirp}(f_m) = \Delta f/1 \text{ mA} = 500 \text{ MHz per mA}$$

As noted above, by operating $i_{sin}(t)$ at different modulation frequencies and counting the number of interfering ripples produced on each modulated frequency, a chirp characteristic curve such as that illustrated in FIG. 2 can be obtained which shows how the chirp for the particular laser diode 2 under test varies as a function of the laser input modulation frequency.

Figure 7:
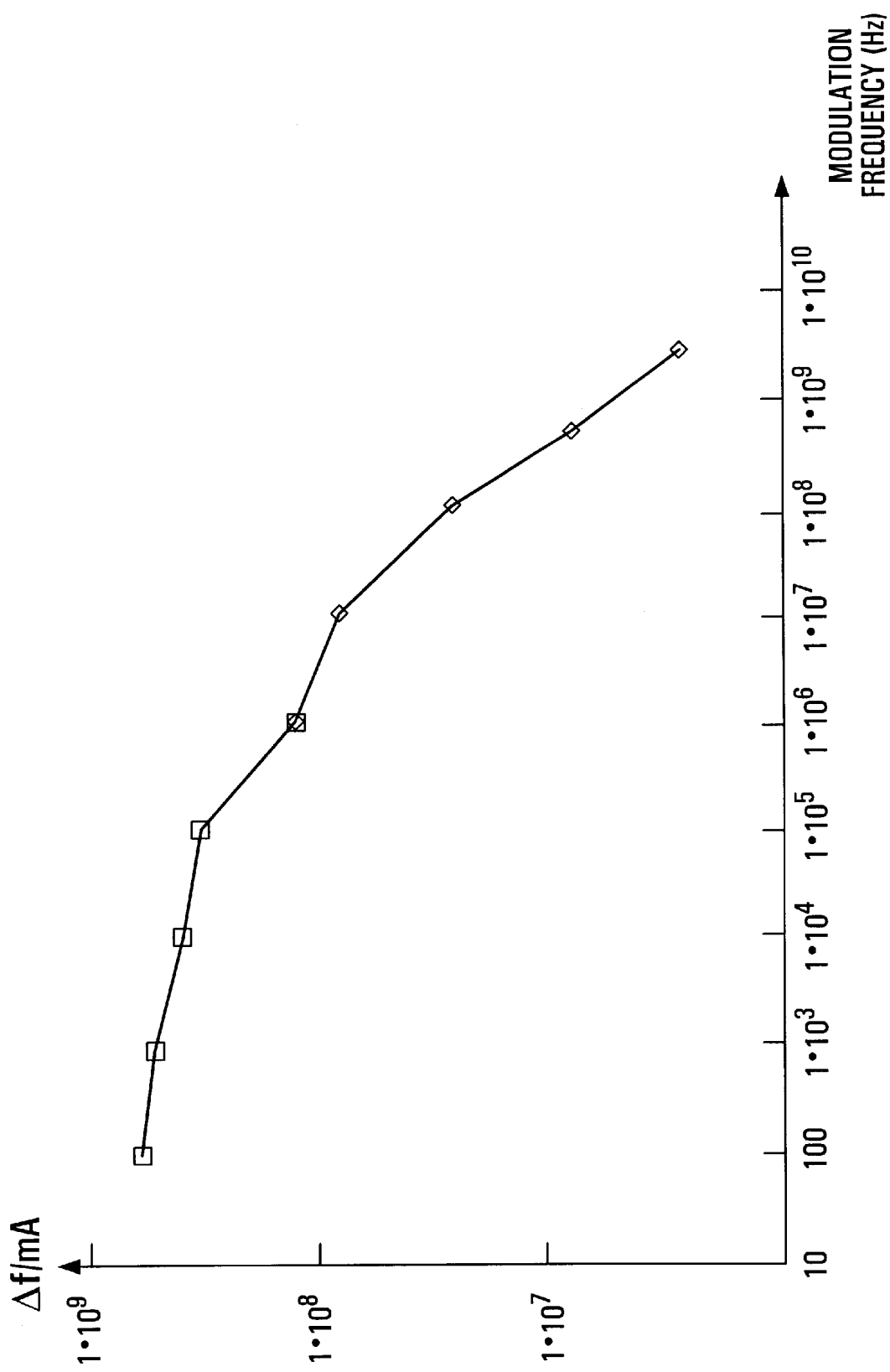
FIG. 7 is a graphical representation of experimental chirp measurements of a typical laser diode obtained with sinusoidal current modulation in accordance with the present invention.

As an example, FIG. 7 illustrates a laser chirp characteristic curve obtained by plotting on a logarithmic scale frequency deviation measurements of a typical distributed feedback (DFB) laser diode for the sinusoidal laser input signal current $i_{sin}(t)$ operated in a modulation frequency range extending from 0 Hz to 3 GHz. From this figure, it can be observed that the DFB laser diode chirp starts at approximately 500 MHz per mA at a modulation frequency of 100 Hz. As the modulation frequency increases, the chirp gradually decreases (as shown in FIG. 2) to eventually fall to approximately 2 MHz per mA for a modulation frequency of 3 GHz. In this particular example, the chirp measurement resolution for modulation frequencies between 0 Hz to 1 MHz is 1.43/10 GHz and the resolution for modulation frequencies between 1 MHz and 10 GHz is 0.2/40 GHz.

Although embodiments of the invention have been described above, it is not limited thereto and it will be apparent to those skilled in the art that numerous modifications form part of the present invention insofar as they do not depart from the spirit, nature and scope of the claimed and described invention.

The AMZI has been described above as converting optical frequency variations in an optical signal into cyclical power variations for chirp measurement. It is to be understood that other interferometers converting variations of optical frequency in cyclical variations in optical power could be used. In particular, any other optical device exhibiting a cyclical transfer function to convert an optical frequency variation into cyclical variations in optical power can be used in accordance with the principles described therein for chirp measurement.

The AMZI has been described above as implemented with two fiber couplers (alternatively referred to as splitters) interconnected with two single-mode fiber arms and a delay line. It is to be understood that other implementations could be used. For example, the AMZI could alternatively be implemented with fused bionic tapered filters or planar light wave circuitry and still provide the necessary cyclical frequency-to-power conversion in accordance with the present invention.

The present invention is not restricted to the balanced photo-detector described therein. Any other photo-detector capable of converting an optical signal into an electrical signal could also be used. For example, a single photo-detector connected to either one of the AMZI outputs could alternatively be used. In this case, the amount of optical power converted by a single photo-detector would always be half that converted by a balanced arrangement and the resulting electrical signal $v_{sin}(t)$ produced would be either positive, oscillating between 0V and +V or negative, oscillating between 0V and −V, depending on which AMZI output is used and whether the photo-detector is pulled to a negative voltage source or a positive voltage source. This is in contrast to an electrical signal produced by a balanced arrangement as was described above which instead would be oscillating around 0V between positive and negative voltage amplitudes +V and −V.

What is claimed is:

1. A method for optical frequency modulation (FM) characterization of a laser source, the laser source being operable under modulation to produce an optical signal which is characterized by frequency variations representative of the modulation, the method comprising:
   modulating the laser source with a cyclical modulation signal to induce frequency variations in the optical signal representative of the cyclical modulation signal;
   using interferometry to convert the frequency variations induced into cyclical optical power variations to produce an intermediate optical signal;
   converting the intermediate optical signal to an electrical signal representative of the cyclical optical power variations in the intermediate optical signal; and
   counting cycles of cyclical voltage variations in the electrical signal for determining the frequency variations induced in the optical signal so as to provide an optical FM characterization of the laser source as a function of the cyclical modulation signal.

2. The method of claim 1 wherein an asymmetrical interferometer is used to convert the frequency variations induced into cyclical optical power variations to produce an intermediate optical signal.

3. The method of claim 2 wherein converting the intermediate optical signal to an electrical signal representative of the cyclical optical power variations in the intermediate optical signal is done by balanced photo-detecting.

4. The method of claim 2 wherein converting the intermediate optical signal to an electrical signal representative of the cyclical optical power variations in the intermediate optical signal is done by single photo-detecting.

5. The method of claim 3 wherein an oscilloscope is used to count cycles of cyclical voltage variations in the electrical signal for determining the frequency variations induced in the optical signal so as to provide an optical FM characterization of the laser source as a function of the cyclical modulation signal.

6. The method of claim 5 wherein the asymmetrical interferometer is a Mach-Zehnder interferometer (AMZI) having cyclical frequency response defining a free spectral range (FSR).

7. The method of claim 6 wherein the AMZI FSR corresponds to a cycle of cyclical optical power variations in the intermediate optical signal and to a cycle of cyclical voltage variations in the electrical signal.

8. The method of claim 7 wherein each frequency variation induced in the optical signal is related to a particular modulation frequency of the cyclical modulation signal.

9. The method of claim 8 wherein for each particular modulation frequency of the cyclical modulation signal, counting cycles of cyclical voltage variations in the electrical signal for determining the frequency variations induced in the optical signal comprises:

counting a number of cycles of cyclical voltage variations in the electrical signal within a half modulation period of the cyclical modulation signal; and multiplying the number of cycles of cyclical voltage variations counted by the FSR of the AMZI to determine the associated frequency variation induced in the optical signal.

10. The method of claim 9 wherein the cyclical modulation signal defines a cyclical modulation signal current.

11. The method of claim 10 wherein to provide an optical FM characterization of the laser source, a laser chirp is calculated for each particular modulation frequency of the cyclical modulation signal by dividing the associated frequency variation induced in the optical signal by the cyclical modulation signal current.

12. The method of claim 11 wherein the cyclical modulation signal is a sinusoidal modulation signal.

13. The method of claim 11 wherein the cyclical modulation signal is a triangular modulation signal.

14. The method of claim 1 wherein the laser source is a laser diode.

15. An apparatus for optical frequency modulation (FM) characterization of a laser source, the laser source being operable under modulation by a cyclical modulation signal to produce an optical signal which is characterized by frequency variations representative of the cyclical modulation signal, the optical circuit comprising:

an asymmetrical interferometer operable to convert the frequency variations induced into cyclical optical power variations to produce an intermediate optical signal;

a photo-detector operable to convert the intermediate optical signal to an electrical signal representative of the cyclical optical power variations in the intermediate optical signal; and an oscilloscope operable to count cycles of cyclical voltage variations in the electrical signal for determining the frequency variations induced in the optical signal so as to provide an optical FM characterization of the laser source as a function of the cyclical modulation signal.

16. The apparatus of claim 15 wherein the asymmetrical interferometer is an asymmetrical Mach-Zehnder interferometer (AMZI) with a cyclical frequency response defining a free spectral range (FSR).

17. The apparatus of claim 16 wherein the AMZI comprises:

an optical splitter connected to receive the optical signal and operable to divide the optical signal received between two unbalanced paths for producing two unbalanced path signals;

an optical coupler operable to combine the unbalanced path signals for producing the intermediate optical signal in the form of a first and second AMZI output signals.

18. The apparatus of claim 17 wherein each frequency variation induced in the optical signal is related to a particular modulation frequency of the cyclical modulation signal and to a respective number of cycles of cyclical voltage variations in the electrical signal.

19. The apparatus of claim 18 wherein to provide an optical FM characterization of the laser source as a function of the cyclical modulation signal, the cyclical modulation signal is selectively operated at different modulation frequencies.

20. The apparatus of claim 19 wherein to provide an optical FM characterization of the laser source, a laser chirp is calculated for each modulation frequency of the cyclical modulation signal based on the associated frequency variation induced in the optical signal.

21. The apparatus of claim 17 wherein for each modulation frequency of the cyclical modulation signal, the unbalanced paths have a path unbalance optical delay selected such that the corresponding frequency variation is converted into a large number of cycles of cyclical optical power variations in the intermediate signal.

22. The apparatus of claim 21 wherein the path unbalanced delay is set to 1 nS.

23. The apparatus of claim 21 wherein the photo-detector consists of a pair of photo-diodes connected in a balanced push-pull arrangement, each photo-diode being respectively operable to receive the first and second AMZI output signals for jointly producing the electrical signal.

24. The apparatus of claim 23 wherein the photo-detector consists of a single photo-diode connected to receive the first AMZI output signal for producing the electrical signal.

25. The apparatus of claim 24 wherein the photo-detector consists of a single photo-diode connected to receive the second AMZI output signal for producing the electrical signal.

26. The apparatus of claim 25 wherein the cyclical modulation signal has been generated by a signal generating function built-into the oscilloscope.

27. The apparatus of claim 26 wherein the laser source is a laser diode.

* * * * *

UNITED STATES PATENT AND TRADEMARK OFFICE
CERTIFICATE OF CORRECTION

PATENT NO. : 6,178,001
DATED : January 23, 2001
INVENTOR(S) : KIM KIHONG

It is certified that error appears in the above-identified patent and that said Letters Patent are hereby corrected as shown below:

Column 5, line 50:

Change "$H_1(f)=A+B\sin^2(\pi f^*\tau), H_2(f)=A+B\cos^2(\pi^* f^*\pi)$" to "$H_1(f)=A+B\sin^2(\pi^* f^*\tau), H_2(f)=A+B\cos^2(\pi^* f^*\tau)$"

Signed and Sealed this

Fifteenth Day of May, 2001

Attest:

NICHOLAS P. GODICI

Attesting Officer     Acting Director of the United States Patent and Trademark Office

UNITED STATES PATENT AND TRADEMARK OFFICE
CERTIFICATE OF CORRECTION

PATENT NO.   : 6,178,001 B1
DATED        : January 23, 2001
INVENTOR(S)  : Kim Kihong It is certified that error appears in the above-identified patent and that said Letters Patent is hereby corrected as shown below:

<u>Column 5,</u>
Line 50, change "$H_1(f)=A+B\sin^2(\pi f^*\tau)$, $H_2(f)=A+B\cos^2(\pi^* f^*\pi)$" to -- $H_1(f)=A+B\sin^2(\pi^* f^*\tau)$, $H_2(f)=A+B\cos^2(\pi^* f^*\tau)$ --

Signed and Sealed this

Fifth Day of October, 2004

JON W. DUDAS
*Director of the United States Patent and Trademark Office*